United States Patent [19]

Han

[11] Patent Number: 5,196,734
[45] Date of Patent: Mar. 23, 1993

[54] CCS LATCH WITH IN-CIRCUIT REDUNDANCY

[75] Inventor: Bing-Hou Han, Hopewell Junction, N.Y.

[73] Assignee: International Business Machines Corporation, Armonk, N.Y.

[21] Appl. No.: 921,188

[22] Filed: Jul. 28, 1992

[51] Int. Cl.[5] .................... H03K 3/284; H03K 19/086
[52] U.S. Cl. ................................ 307/247.1; 307/455; 307/456; 307/272.1; 307/279; 307/272.2; 307/219; 307/308; 307/354
[58] Field of Search ................................ 307/455–456, 307/247.1, 272.1–272.2, 279, 219, 308, 354

[56] References Cited

U.S. PATENT DOCUMENTS 4,810,900 3/1989 Okabe .............................. 307/308

OTHER PUBLICATIONS

IBM Tech. Disc. Bul. vol. 24, No. 12, May 1982, "Latch circuit insensitive to disturb by alpha particles", Eardley.

Primary Examiner—William L. Sikes
Assistant Examiner—Margaret Rose Wambach
Attorney, Agent, or Firm—Eric W. Petraske

[57] ABSTRACT

A Cascode Current Switch latch is made insensitive to single event upset from radiation-induced charge by the addition of two transistors forming a second feedback path that renders one storage node immune to SEU and the other highly resistant.

3 Claims, 2 Drawing Sheets

CCS LATCH WITH IN-CIRCUIT REDUNDANCY

TECHNICAL FIELD

The field of the invention is that of bipolar integrated circuit cascode current switch latches having resistance to single event upsets from radiation-induced charge.

BACKGROUND ART

In the field of integrated circuits, single event upsets (SEU), in which charge stimulated or induced by external radiation is deposited on a node within a latch and causes the latch to switch state, have become more important as transistor size has decreased. The most troublesome charged particles are alpha particles because of their high ionization rate.

Many approaches to the problem have been attempted, depending on the technology; CMOS, emitter coupled logic (ECL), or cascode current switch (CCS), each approach depending on the particular circumstances of the technology in question.

In general, solutions use redundancy or change the gain around the loop t absorb induced charge. In a redundant approach, two latches are connected together, so that the latch will be inverted only when both of the two circuits suffer an alpha-particle strike at the same time. One partial redundant approach, illustrated in Japanese patent 62-81113, takes advantage of extra emitter-follower transistors available in an ECL latch to provide protection for only one of the two storage nodes. This approach is not possible for CCS latches without paying a substantial penalty in increased parts count because the extra emitter-follower transistors are not present. In the gain-modification approach, additional resistance or capacitance is used to absorb the charge induced by the radiation before a transistor can switch state. In the first case, the latch is essentially immune to SEU, while in the second case, the latch is still susceptible to SEU, but only when the charge exceeds some threshold critical charge.

DISCLOSURE OF INVENTION

The invention relates to an improved cascode current switch latch, in which a second feedback path incorporating two additional transistors renders the latch immune to SEU on one node and resistant to SEU with a much higher critical charge on the second node.

BEST MODE OF CARRYING OUT THE INVENTION

Figure 2:
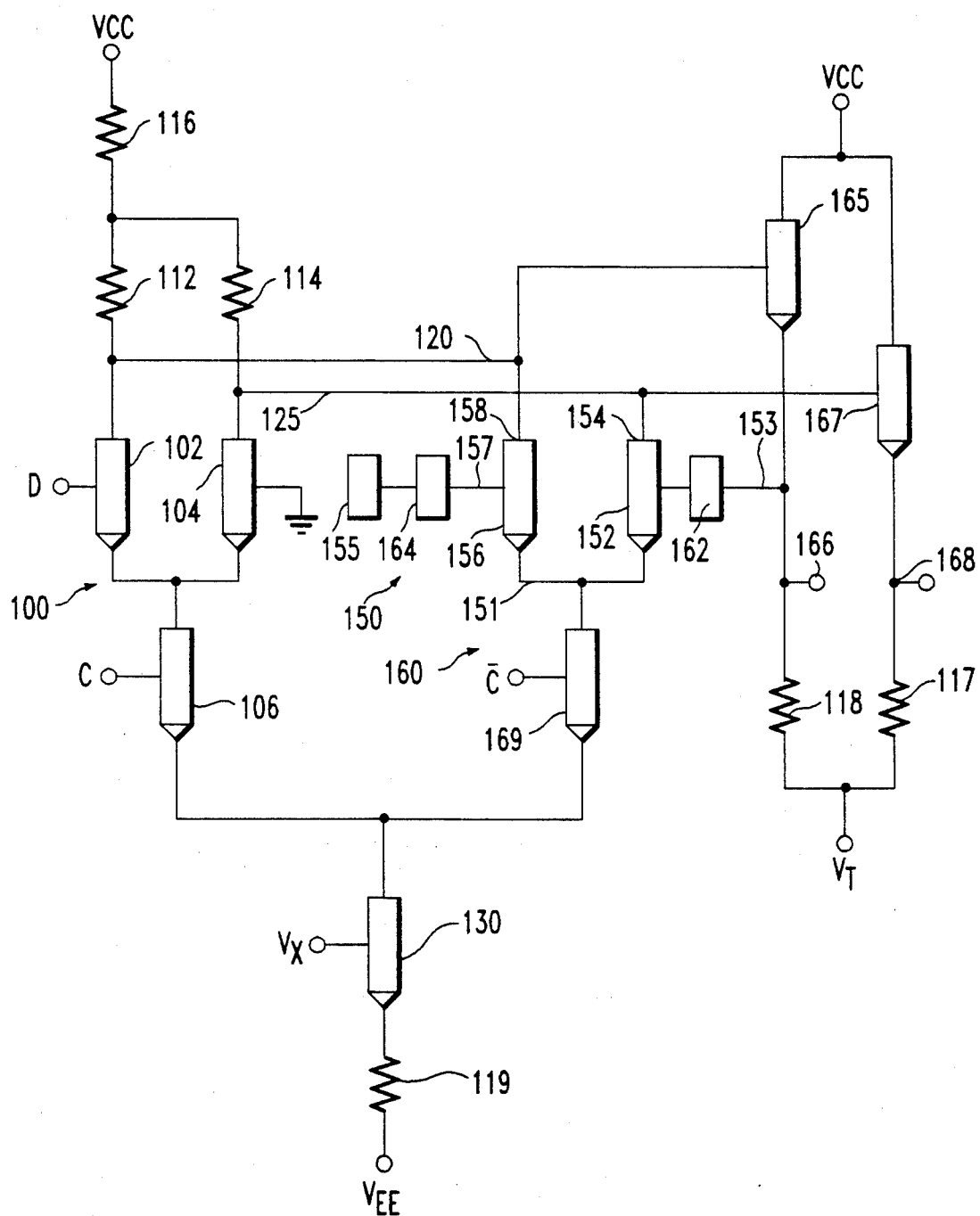
FIG. 2 illustrates schematically a prior art latch.

Referring now to FIG. 2, there is illustrated a prior art cascode current switch latch, in which on the left side an input means including current switch 100, comprising transistors 102, 104 and 106, serves to load data into the storage nodes 120 and 125 in the center of the Figure. In the upper left hand corner, a bias network including resistors 112, 114 and 116 serves to pull node 120 (the out-phase node) or node 125 (the in-phase node) up to the value of the upper voltage terminal (Vcc) when transistor 102 (or transistor 104) is off while transistor 106 is on. Cascode current sources 106 and 169, controlled by a clock C and an inverse $\bar{C}$ serve to source constant currents to the switching transistors in current switches 100 or 150. Current source 130 is controlled in a conventional fashion by a reference $V_x$ as part of the bias network. At the right of the drawing, output transistors 165 and 167 drive output terminals 166 and 168, respectively, to track the state of the storage nodes 120 and 125.

In order to have a latch, there must be a feedback link to latch the value on the storage node. This is provided in the cascode current switch latch of FIG. 2 by an output coupling transistor 165 having its base connected to node 120 and its emitter to an output node 166 that is connected to the base 153 of the second switch transistor 152 of current switch 150. Collector 154 of transistor 152 is connected to node 125 to complete the link between the two nodes. When node 120 is high, transistor 152 is turned on by transistor 165 and node 125 goes low. When node 120 goes low, transistor 152 is off and transistor 156, the other switch transistor, is turned on in the normal operation of a current switch to maintain node 120 low. Node 125 is pulled up by the bias network since transistor 152 is off. This feedback system thus provides the criterion for stable operation of a latch. FIG. 2 has been simplified by the elimination of conventional transistors to provide a reset or scan function, since these are not relevant to the operation of the invention.

The two clock signals C and $\bar{C}$ are controlled so that C is high and $\bar{C}$ is low when data is loaded into the latch. Since $\bar{C}$ is low during the load operation, transistor 169 is off, disabling current switch 150. In the loading operation, data appears on base terminal D of transistor 102 to control the state of the outphase node 120 and the inphase node 125. For example, when D is high, node 120 is low and node 125 is high. When D is low, node 120 is high and node 125 is low. Once the data is loaded into the nodes, the C signal goes low and the $\bar{C}$ signal goes high, locking in the data stored on the storage nodes. When C is low, current switch 100 is disabled, having no further effect on the circuit operation.

If, however, radiation-induced charge (whether from one or more alpha particles or another particle) above some threshold is received on one of the collectors connected to a node that is high, the state of the latch will switch. For example, if node 120 is high and temporarily goes low in response to radiation-induced charge, then transistor 165 will switch from its former state of on to off. Base 153 of transistor 152 will also change state from high to low, thereby turning transistor 152 off. In its former state of on, transistor 152 forced node 125 low. When transistor 152 is turned off, resistor 114 pulls node 125 high and, at the same time, the first switch transistor 156 in current switch 150 turns on, pulling node 120 low. Thus, a stable configuration of the latch in the opposite state has been achieved. The terminology used here is that the state of a node means either high or low; the state of a transistor means on or off; while the state of the latch refers to one node being high and the other being low or vice versa. If an alpha particle or other radiation strikes a node that is low, there is no effect, since the node is merely driven lower. The operation of the circuit will therefore only be discussed with respect to the effect on nodes that are initially high.

As is known in the art, there are many approaches to correct this problem. A simple brute force approach, not illustrated here, is to connect two latches in parallel (wired-or), so that if one latch is hit by an alpha particle and switches, the other latch, remaining unswitched, controls the wired-or node in the original state.

Another approach is to change the gain around the feedback loop—i.e. to render the loop less sensitive to induced charge. In such an approach, a resistor-capacitor network, denoted schematically by the boxes labeled 162 and 164, is connected to the base of the transistors. These networks may be, for example, a resistor in series with the base and a capacitor between the base and ground that together impose an RC value on the feedback loop and thus alter the amplitude and phase of the current (voltage) spike caused by the radiation. This approach will raise the critical charge required to switch the state of the latch, but at the price of slowing down the response time of the latch and increasing the area of the latch. Another approach is to change the bias of the first switch transistor. This is illustrated schematically by the box labeled 155 in FIG. 2. The base of transistor 158 is ordinarily connected to ground, as is the case for transistor 104, but may be connected to a different bias level (as in U.S. Pat. No. 4,755,693) in order to provide greater resistance to radiation-induced charge.

Figure 1:
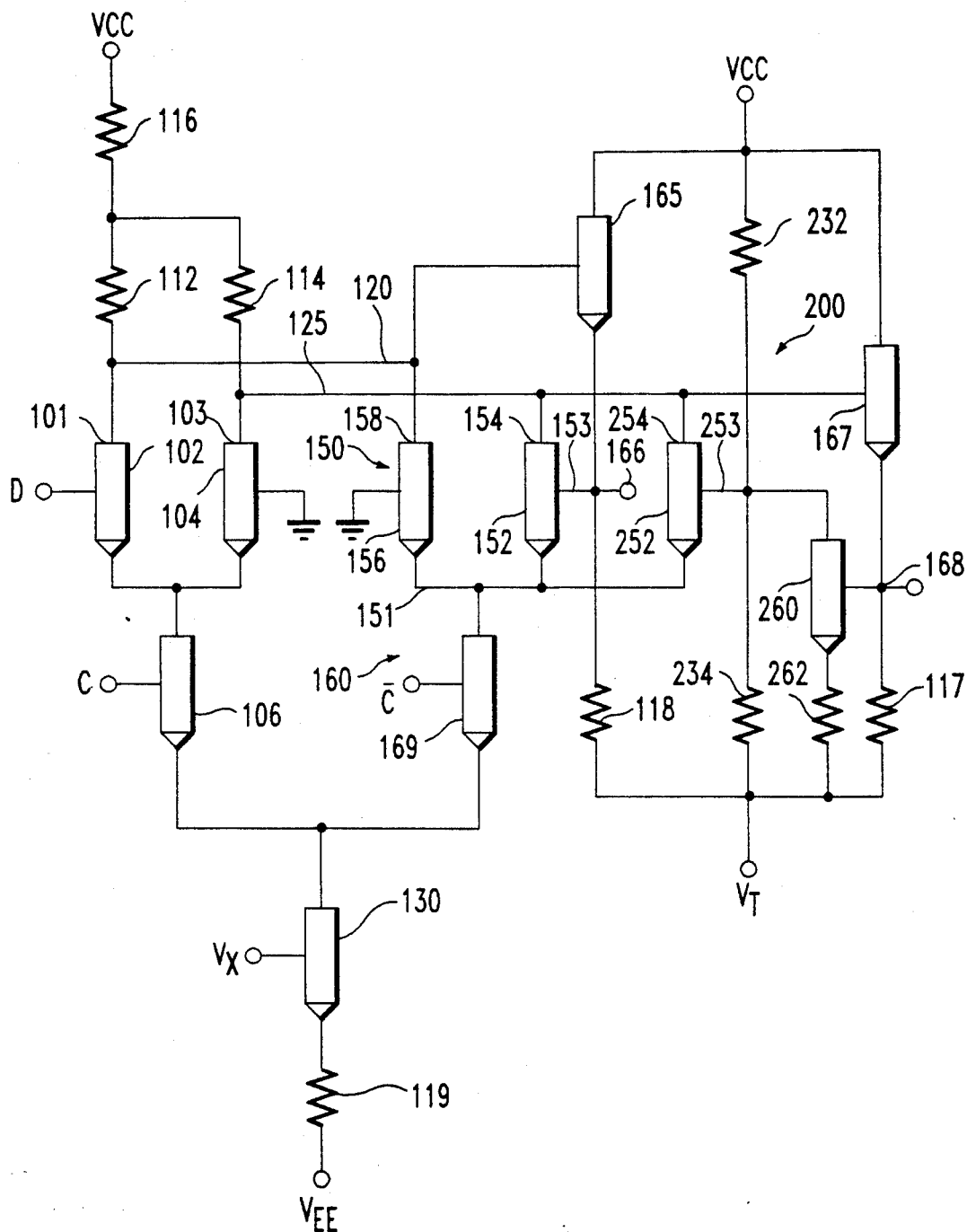
FIG. 1 illustrates schematically an embodiment of the invention.

Referring now to FIG. 1, there is illustrated an embodiment of the invention, in which the same elements have the same numeral as in FIG. 2. In this case, the new elements are indicated generally by the numeral 200 and consist of a third switch transistor 252 in parallel with transistor 152 and an inverter transistor 260 connected between the second output transistor 167 and the third switch transistor to put transistor 252 in the same state as transistor 152 in normal operation. Base 253 of transistor 252 is biased to turn transistor 252 on when transistor 260 is off. The operation of this circuit may be illustrated with reference to Table 1, illustrating two cases for the two states of the latch.

In case 1, node 120 is high and node 125 is low. In this state, the latch is immune to SEU. For example, illustrated on the second line of the table, when an alpha particle strikes collector 101 of transistor 102 or collector 158 of transistor 156, which are both connected to node 120, node 120 goes low (indicated by the arrow). Transistor 152 is switched from its previous state of on to off, but transistor 252 did not change state, holding node 125 low. Transistor 252 did not change state because it is controlled by node 125, which was not affected by the alpha particle strike. A similar result is illustrated on the other line of the table for case 1 in which an alpha strikes node 158 or node 253. Note that in all cases, one of the two parallel switch transistors connected between nodes 151 and 125 remains on, so that node 125 does not switch, but remains on. Since only high nodes are affected by induced radiation, the other nodes need not be discussed for this case.

In contrast, in the alternate state in which node 120 is low and node 125 is high, the latch is sensitive to SEU but the critical charge is greatly increased compared to that of the prior art. For an uncompensated latch of similar construction, the critical charge is typically 50 femto-coulombs and for a latch with reasonable values of capacitance in boxes 162 and 164 the critical charge is approximately 150 femto-coulombs.

In the embodiment of the invention illustrated, the critical charge is greater than 800 femto-coulombs, more than five times that for a comparable circuit using the RC scheme. All comparisons are based on NPN transistor models of the same 0.7 micron rule. Node capacitances within a circuit and intercircuit capacitive loadings were identical in analysis of various soft-error reduction approaches. There are two sizes of transistors used—large with an emitter size of 1.0×3.0 microns and smaller ones with emitter sizes of 0.7×1.5 microns. The larger ones were used for emitter follower outputs (165 and 176). The smaller ones were used for switching and current sources (102, 152, 252, 260, etc.). The base/emitter, base/collector and substrate (CCS) capacitances for the small transistors are 6.8, 6.6, and 3.2 femtofarads. The operating current is 1 ma. The RC value used in the RC scheme were 1.206 Kohms and 50 femtofarads.

In Case 2 on Table 1, if an alpha strikes any of collectors 103, 154 or 254 when node 125 is high, nodes 125 and 168 go low and transistor 260 turns off. Base 253 of transistor 252 is pulled up by the bias network, turning transistor 252 on and thereby forcing node 125 down, so that the latch switches.

The mechanism that raises the critical charge compared to an RC-loaded latch is that the voltage spike has to turn transistor 260 off before transistor 252 will turn on. In contrast, a voltage spike in the prior art circuit has only to pass through the RC-network. Since the RC network loads the output of the prior art output transistor 165, the permissible amount of capacitance is limited by considerations of the switching time of the output. As a result, a relatively short voltage spike will switch the prior art latch, while a much larger spike is required to turn off transistor 260.

Those skilled in the art will appreciate that transistor 260 could be increased in size, thereby increasing the collector capacitance to further increase the critical charge.

TABLE 1

|  | N 120 | T 152 | N 125 | T 260 | N 253 | T 252 |
|---|---|---|---|---|---|---|
| Case 1 | H | ON | L | OFF | H | ON |
| α → 101 | → L | OFF | L | OFF | H | ON |
| α → 158 | → L | OFF | L | OFF | H | ON |
| α → 253 | H | ON | L | OFF | → L | OFF |
| Case 2 | L | OFF | H | ON | L | OFF |
| α → 103 | L | OFF | → L | OFF | H | ON |
| α → 154 | L | OFF | → L | OFF | H | ON |
| α → 254 | L | OFF | → L | OFF | H | ON |

What is claimed is:

1. A cascode current switch integrated circuit latch formed from a plurality of bipolar transistors comprising:
input means for loading data into one of a pair of in-phase and out-phase storage nodes located on first and second current paths extending from an upper voltage terminal to a lower voltage terminal;
a current switch comprising first and second switch transistors having common emitters connected to a switch node and first and second collectors connected to respective ones of said pair of in-phase and out-phase storage nodes, and a first cascode current source connected between said switch node and a lower voltage terminal, said first switch transistor having a first switch base connected to a switch reference voltage;
storage node bias means for biasing said first and second switch transistors so that said current flows through said first switch transistor when said second switch transistor is off and so that said first switch transistor is off when said second switch transistor is on; and a feedback link comprising a first coupling transistor having a coupling base connected to one of said storage nodes and an emitter coupled to a second switch base of said second switch transistor, the collector of said second switch transistor being connected to the other of said storage nodes, whereby said switch node is connected through said current switch to one of said in-phase and out-phase storage nodes in response to the state of said first coupling transistor, thereby connecting said in-phase and out-phase nodes in a stable latch configuration, characterized in that:

a third switch transistor is connected between said other of said storage nodes and said switch node, said third switch transistor having a third switch base connected to a second feedback link;

said second feedback link comprises a second coupling transistor having a second coupling base connected to said other of said storage nodes and an second coupling emitter coupled to said third switch base of said third switch transistor through inverter means, whereby said second and third switch transistors are connected in a wired-or configuration to said switch node and are controlled in response to the state of said in-phase and out-phase storage nodes such that they are in the same state in normal operation; and bias means for biasing said third switch transistor on when said second coupling transistor is off, whereby said latch is immune to single event upset from charge deposited on said one of said storage nodes and is sensitive to single event upset when charge above a predetermined critical charge is deposited on said other of said storage nodes.

2. A latch according to claim 1, further characterized in that:
said first coupling transistor has a coupling base connected to said out-phase storage node;
said second coupling transistor has a second coupling base connected to said in-phase storage node;
said first switching transistor is connected between said switch node and said out-phase storage node; and
said second and third switch transistors are connected between said switch node and said in-phase storage node.

3. A latch according to claim 1, further characterized in that:
said first coupling transistor has a coupling base connected to said in-phase storage node;
said second coupling transistor has a second coupling base connected to said out-phase storage node;
said first switching transistor is connected between said switch node and said in-phase storage node; and
said second and third switch transistors are connected between said switch node and said out-phase storage node.

* * * * *